United States Patent [19]

Miille

[11] 4,270,093
[45] May 26, 1981

[54] APPARATUS FOR FORCING A PHASE-LOCK OSCILLATOR TO A PREDETERMINED FREQUENCY WHEN UNLOCKED

[75] Inventor: Gerard J. Miille, Redwood City, Calif.

[73] Assignee: GTE Automatic Electric Laboratories Incorporated, Northlake, Ill.

[21] Appl. No.: 52,380

[22] Filed: Jun. 27, 1979

[51] Int. Cl.³ .......................... H03L 7/08; H03L 7/14
[52] U.S. Cl. ........................................ 331/17; 331/25
[58] Field of Search .............................. 331/17, 18, 25

[56] References Cited

U.S. PATENT DOCUMENTS

| | | | |
|---|---|---|---|
| 3,223,943 | 12/1965 | Dumaire et al. | 331/17 |
| 3,882,412 | 5/1975 | Apple, Jr. | 331/17 X |
| 4,061,979 | 12/1977 | Walker et al. | 331/17 X |

Primary Examiner—Siegfried H. Grimm
Assistant Examiner—Edward P. Westin
Attorney, Agent, or Firm—Leonard R. Cool

[57] ABSTRACT

An active filter used for the loop filter of a phase-lock loop has one input to the operational amplifier thereof connected to receive the output from a phase detector, and has the non-inverting input connected to receive a control signal from an override signal generator. Under normal operating conditions, the output from the override signal generator is such that it does not affect operation of the active filter and the filter operates as a standard loop filter. During abnormal operating conditions the output signal from the override signal generator is of such magnitude that it causes the operational amplifier and, hence, the filter to output the maximum voltage +V. The filter output is connected to one end of a pair of serially connected resistors which have the node connected to the control voltage input of the voltage control oscillator. The other end of the serially connected resistors is connected to the collector of a transistor. The emitter of the transistor is connected to a reference voltage −V and the base is connected through a bias circuit to the output of the override signal generator. The presence of the override signal causes the transistor to conduct thus, connecting the serially connected resistors between +V and −V. The value of the serially connected resistors are selected so that the node voltage supplies a predetermined value of control voltage to the control input of the VCO to set the predetermined frequency.

5 Claims, 3 Drawing Figures

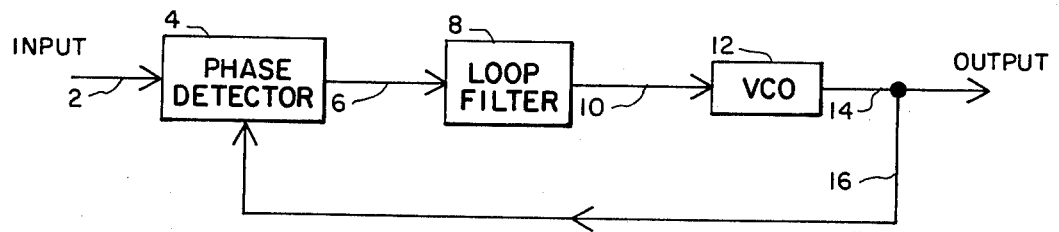
(PRIOR ART)
FIG. 1
FIG. 2
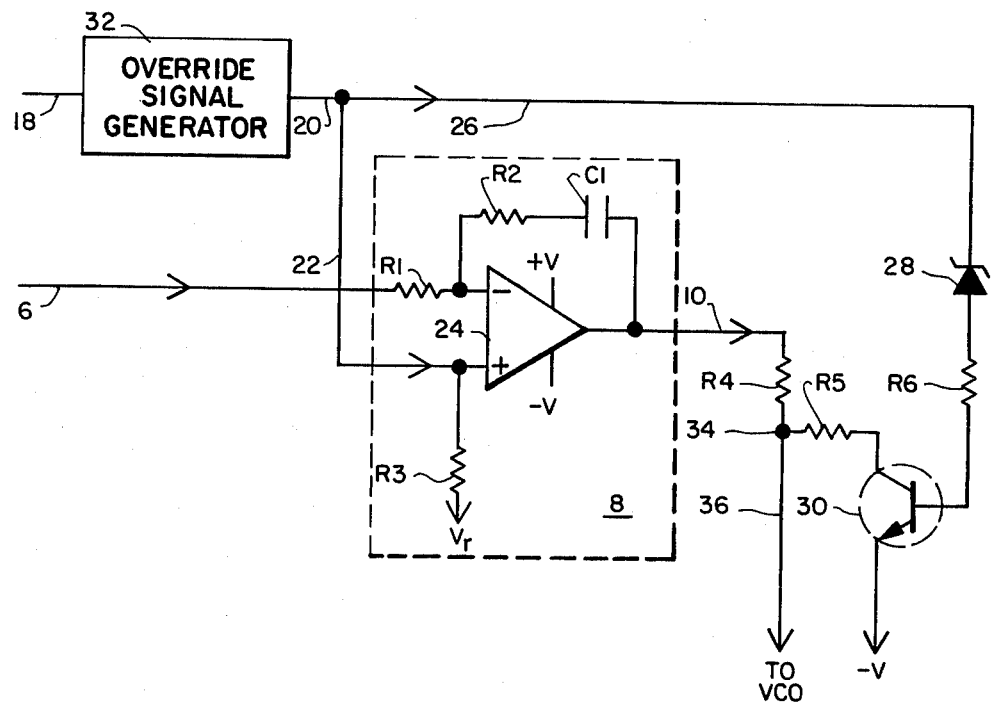
FIG. 3
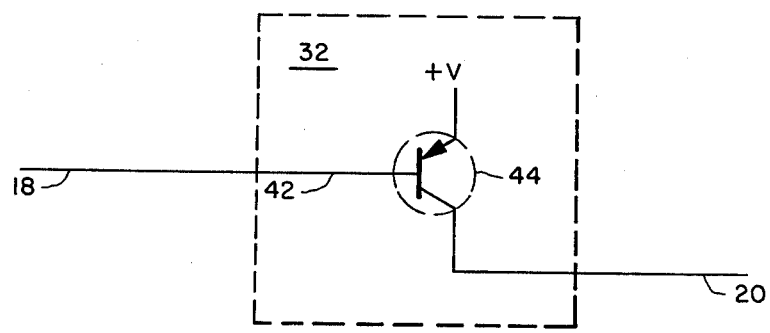

APPARATUS FOR FORCING A PHASE-LOCK OSCILLATOR TO A PREDETERMINED FREQUENCY WHEN UNLOCKED

THE BACKGROUND OF THE INVENTION

1. Field of the Invention

This invention relates to phase-locked loop (PLL) circuits, and, more particularly, to a circuit used in conjunction with an active loop filter to set the frequency of the voltage controlled oscillator to a predetermined frequency under abnormal operating conditions.

2. Background Description

A standard phase-lock loop comprises a phase detector, a loop-filter and a voltage controlled oscillator with a feedback circuit connected from the output of the voltage controlled oscillator (VCO) to the input of the phase detector. A reference frequency is applied to a second input to the phase detector and the output of the VCO is compared with this reference frequency to obtain an error signal which passes through the loop filter and then is applied as the control voltage to the control input of the VCO. The loop filter may be either passive or active; and, where an active filter is employed, it may provide an output signal which is either of two extreme levels, causing the VCO frequency to shift to its maximum or minimum operational frequency, when there is a loss of reference frequency. Such a condition also may be effected during alarm conditions from other elements of a system in which the phase lock loop is only a part. The loss of the reference frequency or an alarm condition would be considered as abnormal conditions, and when the loss of input or the presence of an alarm condition is removed, and the appropriate reference frequency is again applied to the phase detector, it is desirable that phase-locking should be acquired in the minimum possible time. Most often such a result may be obtained where the output of the voltage controlled oscillator has been forced to a frequency which is quite close to its normal operating frequency. Quite often this normal operating frequency is the nominal (or center) frequency of the VCO.

One technique for accomplishing such a result is disclosed in U.S. Pat. No. 3,882,412; "Drift Compensated Phase Lock Loop," by Garrett Gordon Apple, Jr. In the phase lock loop circuit of the referenced patent, a compensation means is disposed between the loop filter and the voltage control oscillator and a control means is disposed between the input to the phase lock loop and an input to the compensation means. The control means include a signal presence monitor, which simply determines whether or not the input signal to the phase lock loop is present. Further, it includes a very low frequency clock source, i.e., one pulse per hour or even per day, and an AND-gate which AND's the output of the signal presence monitor and the low frequency clock to provide an output clock signal to an up/down N-BIT counter which is included in the compensation means. Disadvantages of the disclosed technique are (1) the complexity of the circuit arrangement used, and (2) the operating delay which may permit the control voltage to be shifted off frequency prior to the time that the output voltage would have been locked to a particular value upon loss of the input signal.

SUMMARY OF THE INVENTION

A control circuit for forcing a phase-locked oscillator to a predetermined operating frequency under abnormal operating conditions includes first means responsive to the abnormal operating condition for generating an override signal at an output; a second means responsive to the override signal for forcing the output voltage of the active loop-filter to a predetermined value; and a third means responsive both to the override signal and the predetermined value to create a predetermined control voltage which is applied to the control input of the phase-lock oscillator.

BRIEF DESCRIPTION OF THE DRAWING

FIG. 1, depicts a prior art phase lock loop;

FIG. 2, depicts the control circuit used in conjunction with an active loop filter to provide a predetermined control voltage during abnormal operating conditions; and FIG. 3 illustrates an embodiment of override signal generator (32).

DETAILED DESCRIPTION OF THE INVENTION

Referring now to FIG. 1, a phase-lock loop of the prior art is shown. The input on path 2 is the reference frequency input from some source which may, for example, be a clock recovery circuit in a digital transmission system. This input signal is applied as one input to phase detector 4, with a second input being fed back from the output of the voltage controlled oscillator along path 16. Phase detector 4 compares the phase of the reference frequency with the phase of the voltage controlled oscillator 12, and provides at the output a phase-error signal which is a measure of the phase difference between the two inputs. This phase-error signal is applied on path 6 to the input of loop filter 8. The output of loop filter 8 is a control voltage which is applied, via path 10, to the control input of the voltage controlled oscillator. The amplitude of this voltage is used to change the frequency of the output signal from the voltage controlled oscillator in a direction which tends to reduce the phase difference between the reference signal and the signal output of the VCO. When the loop is "locked," the control voltage is such that the frequency of VCO 12, is exactly equal to the average frequency of the reference signal. As is common with most feedback control systems, it is necessary, in order to maintain the control voltage needed for the lock, to have a non-zero phase-error signal output from the phase detector. Thus, as a practical matter, the loop normally operates with some phase error present.

Where an abnormal condition occurs, e.g., the input frequency on path 2 is lost, the phase detector output, on path 6, may then provide either a phase-error signal of zero or of an extreme value depending upon the character of the phase detector. This also could be reflected through a passive loop filter so that an extreme control voltage could be applied to VCO 12, thus, shifting the output frequency to one extreme of its range. If the loop filter 8 is of the active type, which is becoming quite common today, the output on path 10 could go to either extreme, thus causing the output frequency on path 14 to be "pegged" at one extreme frequency or the other of its control range.

In order to prevent the VCO from being forced to its extreme frequency position, a control circuit consisting of an override signal generator, a voltage divider network, a transistor, and a bias circuit for the transistor may be arranged as shown in FIG. 2, to provide a predetermined control voltage to the control input of the VCO during abnormal operating conditions. The output of phase detector 4, FIG. 1, appears on path 6, and is applied via resistor R1 to the inverting input of operational amplifier 24. The feedback network between the output and the inverting input of the operational amplifier is made up of a series connected circuit comprising resistor R2 and capacitor C1 as shown. Other arrangements of the feedback network are possible, but it has been determined that this series RC circuit provides operating advantages over, e.g., a parallel RC circuit. It is readily apparent that the active filter shown as 8 in FIG. 2, is conventional. Reference voltage Vr is normally selected to have a value which is equal to the mid-range value of the phase-error signal obtained from the phase detector. During normal operating conditions, the difference between reference voltage Vr and the phase-error signal is amplified in amplifier 24 to produce the control voltage. Therefore, under normal operating conditions the output of the filter on path 10 would be under the control of the phase-error signal applied on path 6, to the filter input. Usually, the output of the filter on path 10 would then vary about a nominal voltage that is approximately half way between the voltages +V and −V which are applied to the operational amplifier 24 as shown. But it should be understood that operation of the phase-lock loop is designed so that the control voltage will be such as to cause the VCO to have the same frequency as that of the input frequency on path 2, FIG. 1. Also, under normal operating conditions the override signal generator 32 is arranged to provide an open circuit to its output, and thus there is no affect on the operation of amplifier 24 from this source. Thus, the output of amplifier 24 on path 10 is controlled by the phase detector signal on path 6. Further, the output on path 10 provides the VCO control voltage which is applied directly to the VCO control input. This occurs because transistor 30 is biased off by the output voltage from the override signal generator 32.

An embodiment of an override signal generator which will provide the desired output voltages is shown in FIG. 3. Under normal operating conditions transistor 44 is biased off by the input voltage on path 18 and an open collector, i.e., high impedance output, is provided and is applied to path 20. Thus, the override signal generator 32 is effectively isolated from the loop filter and the filter operates normally. However, under abnormal operating conditions the voltage on path 18 is changed to reverse the bias on transistor 44. This turns on transistor 44 and applies the +V voltage via the emitter-collector junction and path 22 to the non-inverting input of operational amplifier 24.

When the override signal generator 32 provides a +V output, this +V voltage is applied to the non-inverting input of amplifier 24 and forces the output of the amplifier to +V which appears on path 10. This is the positive extreme voltage output available from the amplifier. At the same time the bias circuit is controlled by the override signal.

Referring to FIG. 2, it may be seen that the output from override signal generator 32 is applied along path 26 to the bias circuit consisting of Zener diode 28 and resistor R6. The normal override signal generator output, i.e., an open collector, causes transistor 30 to be biased to the off condition, which renders the voltage divider comprising resistors R4 and R5 ineffective. Thus, the control voltage on path 10 passes to resistor R4, node 34 and path 36, directly to the voltage controlled amplifier 12.

Under abnormal operating conditions, transistor 44 is biased on by the input to the override signal generator and this causes the voltage level on path 20 to go substantially to +V. As previously noted, abnormal operating conditions can mean loss of the input reference frequency on path 2, or it could be an alarm condition caused by a loss of frame synchronization in a digital transmission system. These are only examples of the kinds of abnormal conditions which may occur to adversely affect the VCO output. However, it is important that such a condition be recognized and therefore, the override generator may be connected to standard alarm outputs, for example, from frame synchronization detectors so as to effect the abnormal output condition from the override signal generator, when such abnormal conditions occur. When the output of the override signal generator 32 goes high, i.e., to +V, it applies this voltage to the non-inverting input of operational amplifier 24. The amplitude of the voltage is high enough so that it would always be higher (more positive) in voltage than the input to the inverting input of the operational amplifier 24. Because of this, the output of the active filter is forced to the +V level, which is the voltage that is now applied to path 10. At the same time, the positive potential +V is applied to the bias circuit via path 26 causing the transistor 30 to turn on. By so doing, the voltage divider consisting of resistors R4 and R5 is connected between the +V and −V potentials. This causes the voltage at node 34 to be fixed by the voltage divider network, since the output of the operational amplifier 24 is no longer affected by the output of the phase detector. Thus, the control voltage value which may be applied to the VCO during abnormal operating conditions may be readily controlled by proper selection of the resistors in the voltage divider network. These would be selected to provide the desired predetermined frequency output under such abnormal conditions.

While the invention has been particularly shown and described with reference to a preferred embodiment thereof, it will be understood by those skilled in the art that change in form and detail may be made therein without departing from the spirit and scope of the invention.

What is claimed is:

1. In a phase-lock loop which includes a phase detector having an output terminal and a voltage control oscillator (VCO) having a control input terminal, apparatus for forcing the VCO to provide a predetermined output frequency under abnormal conditions comprising:

first means responsive to said abnormal operating conditions for generating an override signal at an output terminal;

second means, having a first input terminal connected to the output terminal of said phase detector, and having a second input terminal connected to the output terminal of said first means and responsive to said override signal for deriving a voltage having a predetermined value at an output terminal; and third means, having a first input terminal connected to the output terminal of said first means and having a second input terminal connected to the output terminal of said second means, said third means being responsive both to said override signal and said predetermined voltage to develop a selected portion of said predetermined voltage which is available at an output terminal of said third means and is applied to the control input terminal of said VCO, whereby said predetermined frequency is obtained.

2. Apparatus as set forth in claim 1, wherein said second means further comprises;

an RC active filter including an operational amplifier having the inverting input connected to the output terminal of said phase detector, having the non-inverting input connected both to a reference voltage and to the output terminal of the said first means, and providing at an output terminal said voltage of said predetermined value when said abnormal condition exists.

3. Apparatus as set forth in claim 2, wherein said third means further comprises:

means for proportioning the predetermined voltage from the output of said operational amplifier; and means for activating said proportioning means so as to provide said selected portion of said predetermined voltage at said output terminal of said third means.

4. Apparatus as set forth in claim 2, wherein said third means further comprises:

a transistor having base, emitter and collector electrodes, and having the emitter connected to a bias voltage supply source;

a voltage divider comprising a first resistor having one end thereof connected to the output terminal of the operational amplifier, having a second resistor having one end thereof connected to the collector of said transistor, and the other end connected to the other end of said first resistor forming a node which is connected to the control input terminal of said VCO; and a base bias circuit adapted for connection between the base of said transistor and the output terminal of said first means for controlling the operation of said transistor so as to turn said transistor on when said abnormal condition exists to provide a path via the output of said operational amplifier, said first and second resistors and the collector and emitter of said transistor, thereby setting the voltage at said node at a fixed value which is equal to the desired value for the predetermined control voltage.

5. Apparatus as set forth in claim 4, wherein said base bias circuit further comprises;

a third resistor having one end thereof connected to the base electrode of said transistor; and a Zener diode having the anode thereof connected to the other end of said third resistor and having the cathode connected to the output terminal of said first means.

* * * * *